(12) United States Patent
Chang et al.

(10) Patent No.: US 11,553,621 B2
(45) Date of Patent: Jan. 10, 2023

(54) HEAT DISSIPATION BASE

(71) Applicant: Auras Technology Co., Ltd., New Taipei (TW)

(72) Inventors: Cheng-Ju Chang, New Taipei (TW); Ming-Yuan Lo, New Taipei (TW); Ching-An Liu, New Taipei (TW)

(73) Assignee: AURAS TECHNOLOGY CO., LTD., New Taipei (TW)

( * ) Notice: Subject to any disclaimer, the term of this patent is extended or adjusted under 35 U.S.C. 154(b) by 210 days.

(21) Appl. No.: 17/125,583

(22) Filed: Dec. 17, 2020

(65) Prior Publication Data

US 2021/0345517 A1 Nov. 4, 2021

Related U.S. Application Data

(60) Provisional application No. 63/017,321, filed on Apr. 29, 2020.

(30) Foreign Application Priority Data

Dec. 8, 2020 (TW) .................. 109143264

(51) Int. Cl.
*H05K 7/20* (2006.01)
*F28D 15/02* (2006.01)
*H01L 23/427* (2006.01)

(52) U.S. Cl.
CPC ....... *H05K 7/2039* (2013.01); *F28D 15/0275* (2013.01); *H01L 23/427* (2013.01)

(58) Field of Classification Search
CPC ............. H05K 7/2039; H05K 7/20336; H05K 7/20409; F28D 15/0275; H01L 23/427
See application file for complete search history.

(56) References Cited

U.S. PATENT DOCUMENTS

| 7,885,072 | B2* | 2/2011 | Wu | ............... | H01L 23/4006 |
|---|---|---|---|---|---|
| | | | | | 165/185 |
| 9,054,076 | B2* | 6/2015 | Wu | ............... | H01L 23/427 |
| 10,212,859 | B2* | 2/2019 | Yu | ............... | F28D 15/0275 |
| 10,721,838 | B1* | 7/2020 | Bhatia | ............... | H05K 7/20809 |
| 2007/0151711 | A1* | 7/2007 | Chen | ............... | H01L 23/427 |
| | | | | | 29/890.032 |
| 2012/0085520 | A1* | 4/2012 | Pfaffinger | ............... | H01L 23/433 |
| | | | | | 165/104.26 |
| 2013/0008630 | A1* | 1/2013 | Yuan | ............... | H01L 23/427 |
| | | | | | 165/185 |
| 2013/0020052 | A1* | 1/2013 | Huang | ............... | H01L 23/433 |
| | | | | | 165/104.21 |
| 2013/0168056 | A1* | 7/2013 | Wu | ............... | F28D 15/0275 |
| | | | | | 165/104.26 |
| 2013/0294030 | A1* | 11/2013 | Wang | ............... | G06F 1/203 |
| | | | | | 165/104.21 |

(Continued)

*Primary Examiner* — Jon T. Schermerhorn, Jr.
(74) *Attorney, Agent, or Firm* — Muncy, Geissler, Olds & Lowe, P.C.

(57) ABSTRACT

A heat dissipation base includes a fixing plate and a metal heat conduction block. The fixing plate includes a plurality of heat pipe partitions and a plurality of heat pipe fixing openings, and the heat pipe fixing openings are formed between the heat pipe partitions. The metal heat conduction block is fixed to the fixing plate, and the fixing plate further includes a plurality of supporting portions to support shear surfaces at two ends of the heat conduction block.

8 Claims, 7 Drawing Sheets

(56) References Cited

U.S. PATENT DOCUMENTS

| | | | |
|---|---|---|---|
| 2014/0182817 A1* | 7/2014 | Yu | F28D 15/0275 165/104.21 |
| 2014/0202666 A1* | 7/2014 | Cheng | H01L 23/427 165/104.26 |
| 2016/0169591 A1* | 6/2016 | Thiagarajan | F28D 15/02 165/104.21 |
| 2016/0273844 A1* | 9/2016 | Yu | F28D 15/0233 |
| 2017/0055372 A1* | 2/2017 | Ahamed | F28D 15/0275 |
| 2017/0080533 A1* | 3/2017 | Lin | B23P 15/26 |
| 2017/0082377 A1* | 3/2017 | Lin | H01L 21/4882 |
| 2017/0153063 A1* | 6/2017 | Lin | F28D 15/0233 |
| 2018/0252483 A1* | 9/2018 | Geng | H01L 23/3672 |
| 2018/0283797 A1* | 10/2018 | Tochigi | F28D 15/0233 |
| 2019/0014689 A1* | 1/2019 | Yu | F28F 1/02 |
| 2020/0205316 A1* | 6/2020 | Weng | H05K 7/20218 |
| 2020/0381329 A1* | 12/2020 | Morimoto | F28D 20/0056 |
| 2022/0110224 A1* | 4/2022 | Gong | H05K 7/20336 |

\* cited by examiner

HEAT DISSIPATION BASE

RELATED APPLICATIONS

This application claims priority to U.S. Provisional Application Ser. No. 63/017,321, filed Apr. 29, 2020, and Taiwan Application Serial No. 109143264, filed Dec. 8, 2020, the disclosures of which are incorporated herein by reference in their entireties.

TECHNICAL FIELD

The present disclosure generally relates to a heat dissipation base. More particularly, the present disclosure relates to a shear resistant heat dissipation base.

BACKGROUND

With the increasing computing power of computers, the temperature control of electronic components such as central processing units and other electronic components is becoming more and more important. At present, most computers with high-speed computing performance use active cooling modules. The cooling module basically includes a fan, a heat pipe and cooling fins. The heat pipe utilizes a copper block fixed on the heat dissipation base to connect to a heat source, e.g. a central processor unit, and the heat pipe is also connected to the cooling fins, so that the heat is transferred to the cooling fins through the heat pipe. The cooling fins are assembled at the outlet of the fan, and the heat of the cooling fins is taken out of the computer by the airflow of the fan so as to stabilize the operation of the electronic component.

However, when the cooling module is fixed on a carrier board with fastening devices and screws, the substrate of the heat dissipation base has to bear a downward force generated by the screws, and the copper block in the heat dissipation base has to bear an upward force generated by the electronic component, so that the copper block may be recessed relative to the substrate of the heat dissipation base at the two ends of the rectangular copper block due to the shear force action. The depression phenomenon may reduce the heat dissipation efficiency of the cooling module.

Therefore, there is a need to improve the capability of the cooling module to resist the shear force between the copper block and the substrate so as to improve the heat dissipation efficiency of the cooling module.

SUMMARY

One objective of the embodiments of the present invention is to provide a heat dissipation base able to improve the heat dissipation efficiency of the heat dissipation base and further improve the heat dissipation efficiency of the cooling module.

To achieve these and other advantages and in accordance with the objective of the embodiments of the present invention, as the embodiment broadly describes herein, the embodiments of the present invention provides a heat dissipation base including a fixing plate and a metal heat conduction block. The fixing plate includes a plurality of heat pipe partitions and a plurality of heat pipe fixing openings, and the heat pipe fixing openings are formed between the heat pipe partitions. The metal heat conduction block is fixed to the fixing plate, and the fixing plate further includes a plurality of supporting portions to support shear surfaces at two ends of the metal heat conduction block.

In some embodiments, the heat dissipation base further includes a plurality of heat pipes fixed in the heat pipe fixing openings.

In some embodiments, the heat pipe fixing openings form an angle with the shear surfaces.

In some embodiments, the angle is greater than 5 degrees and less than 60 degrees.

In some embodiments, the supporting portions include a plurality of reinforcement ribs fixed on two sides, perpendicular to the shear surfaces, of the fixing plate.

In some embodiments, the supporting portions include a ring-shaped reinforcement rib surrounding the fixing plate and the metal heat conduction block.

In some embodiments, the fixing plate includes a plurality of extended indentations form at two ends of the fixing plate, and the supporting portions include a plurality of extended supporting portions formed in the extended indentation. In addition, the metal heat conduction block includes a metal heat conduction block main body and a plurality of metal heat conduction block extended portions formed at two ends of the metal heat conduction block main body, and the metal heat conduction block extended portions are positioned in the extended indentations and fixed on the extended supporting portions.

In some embodiments, the supporting portions further include a plurality of partition supporting portions formed adjacent to the shear surfaces to further support the metal heat conduction block.

In some embodiments, an extended supporting portion length of the extended supporting portions of the fixing plate is less than 25% of a length of the metal heat conduction block, and an extended supporting portion width of the extended supporting portions is about 35% to 75% of a width of the metal heat conduction block.

In some embodiments, the metal heat conduction block and the fixing plate are soldered by a tin-bismuth alloy or a tin-silver-copper alloy.

Hence, the heat dissipation base can effectively increase the connection strength between the fixing plate and the metal heat conduction block, increase the shear force resistant capability, solve the depression defects, and increase the heat dissipation efficiency of the heat dissipation base and the heat dissipation efficiency of the cooling module with the heat dissipation base.

BRIEF DESCRIPTION OF THE DRAWINGS

The foregoing aspects and many of the attendant advantages of this invention will be more readily appreciated as the same becomes better understood by reference to the following detailed description, when taken in conjunction with the accompanying drawings, wherein.

DETAILED DESCRIPTION OF THE PREFERRED EMBODIMENT

The following description is of the best presently contemplated mode of carrying out the present disclosure. This description is not to be taken in a limiting sense but is made merely for the purpose of describing the general principles of the invention. The scope of the invention should be determined by referencing the appended claims.

Figure 1:
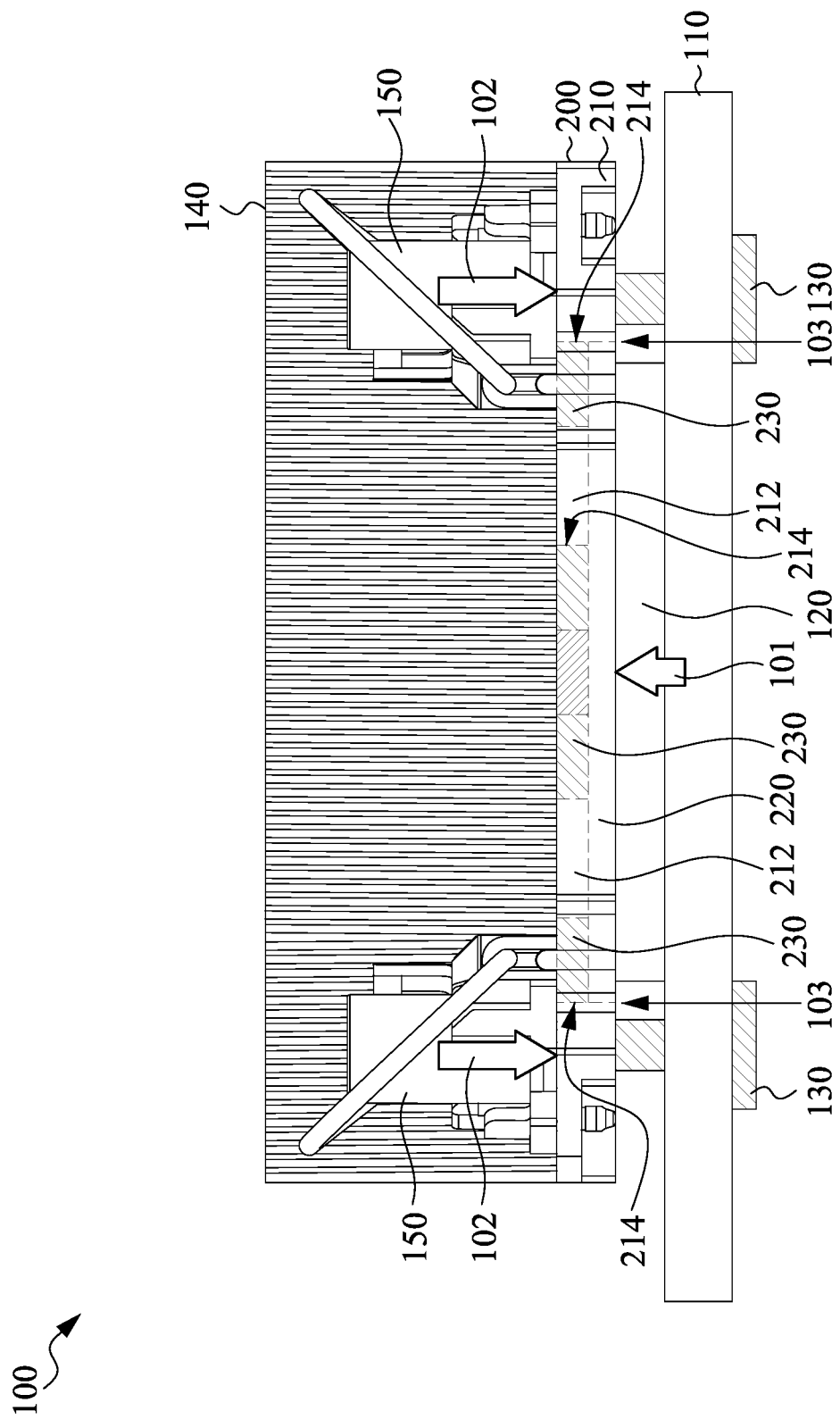
FIG. 1 illustrates a schematic side view showing a heat dissipation base equipped in a cooling module according to one embodiment of the present invention.
Figure 2:
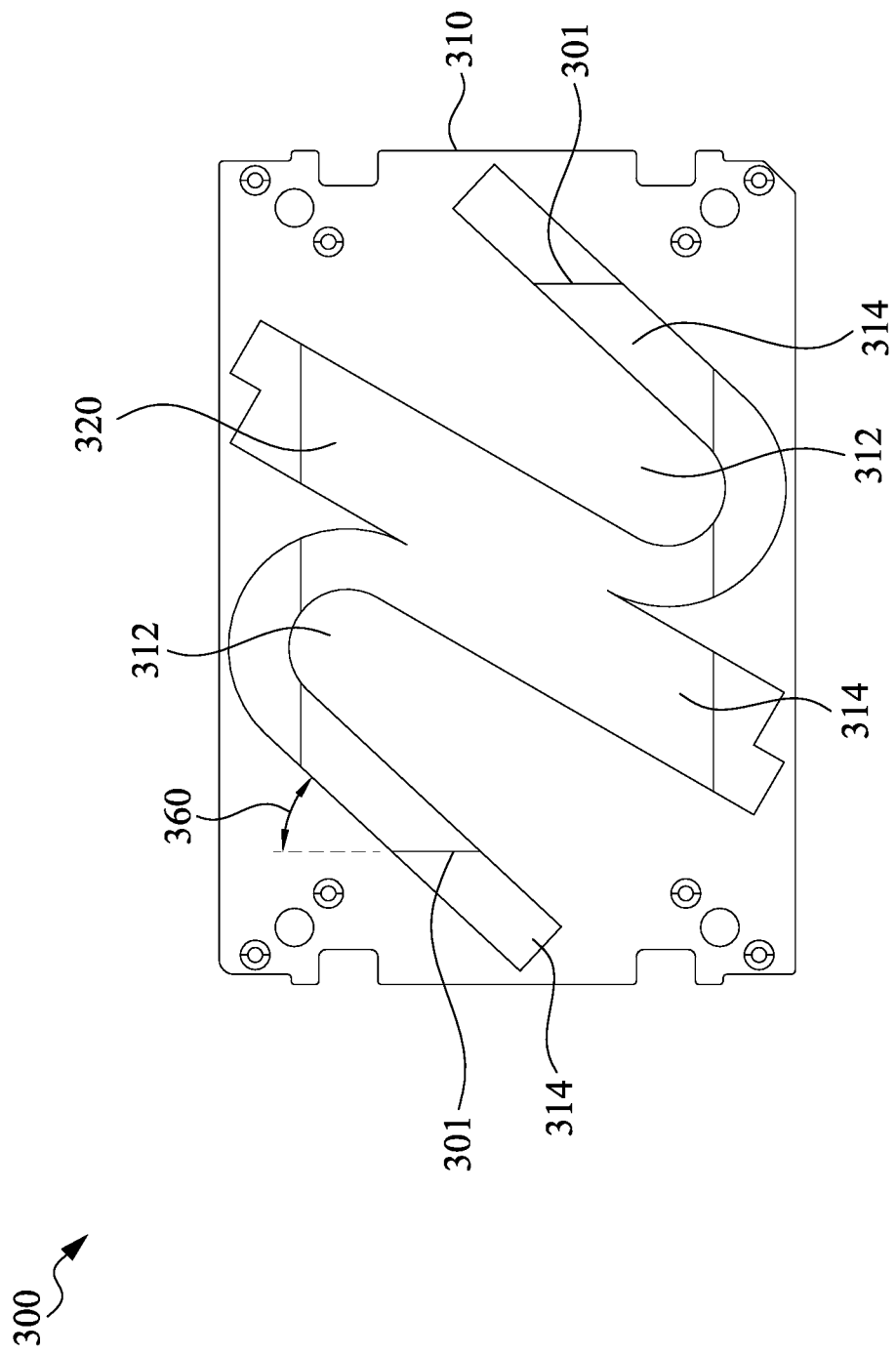
FIG. 2 illustrates a schematic top view showing a heat dissipation base according to one embodiment of the present invention.
Figure 3:
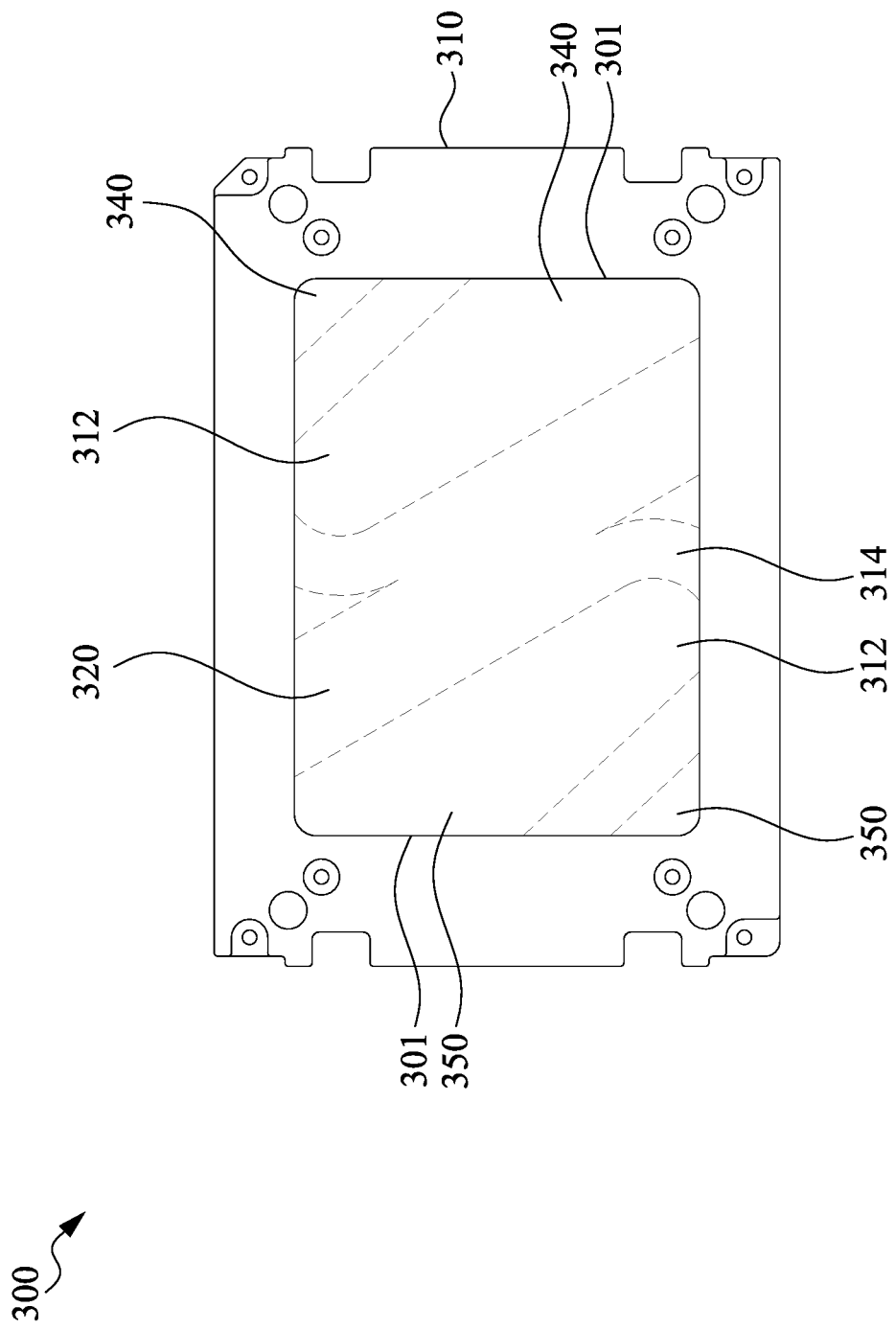
FIG. 3 illustrates a schematic bottom view of FIG. 2.

FIG. 1 illustrates a schematic side view of a heat dissipation base equipped in a cooling module according to one embodiment of the present invention, FIG. 2 illustrates the top view of a heat dissipation base, FIG. 3 illustrates a bottom view of FIG. 2, and FIGS. 4 to 7 illustrate schematic views of various heat dissipation bases.

Referring to FIG. 1, a cooling module 100 includes a heat dissipation base 200, a plurality of cooling fins 140, a plurality of heat pipes 230 fixed between the heat dissipation base 200 and the cooling fins 140, and a plurality of fastening devices 150. The cooling module 100 is fixed on the carrier board 110 with the fastening devices 150 and fixing screws 130 to dissipate the heat generated by the electronic component 120 disposed on the carrier board 110.

The heat dissipation base 200 includes a fixing plate 210 and a metal heat conduction block 220 fixed on the fixing plate 210, and the fixing plate 210 includes a plurality of heat pipe partitions 212 and a plurality of heat pipe fixing openings 214, the heat pipe fixing openings 214 are formed between the heat pipe partitions 212, and heat pipes 230 are arranged along the heat pipe fixing openings 214 and fixed in the heat pipe fixing openings 214 to allow the heat pipes 230 to contact the cooling fins 140 on the fixing plate 210 and the metal heat conduction block 220 under the fixing plate 210 so as to transfer the heat generated by the electronic component 120 to the cooling fins 140 for heat dissipation.

It is worth noting that, at the two ends, adjacent to the fixing screws 130, of the metal heat conduction block 220, shear surfaces 103 may be occurred between the metal heat conduction block 220 and the fixing plate 210. Because that the metal heat conduction block 220 is fixed in the fixing plate 210 and located in the bottom half of the fixing plate 210, the electronic component 120 on the carrier board 110 may generate an action force 101 upward, and the fixing screws 130 may generate action forces 102 on the fixing plate 210 downward while the cooling module 100 is fixed on the carrier board 110 by the fixing screws 130 and the fastening devices 150. The action force 101 and the action forces 102 may cause shear surfaces 103 between the metal heat conduction block 220 and the fixing plate 210. When the shear force is greater, the metal heat conduction block 220 and the fixing plate 210 may generate a greater deformation adjacent to the shear surfaces 103. A depression or separation adjacent to the shear surfaces 103 may be generated between the metal heat conduction block 220 and the fixing plate 210 because that the metal heat conduction block 220 is sunk in the heat pipe fixing openings 214 of the fixing plate 210. In addition, the depression or separation between the metal heat conduction block 220 and the fixing plate 210 may reduce the heat dissipation efficiency of the heat dissipation base 200 and further reduce the heat dissipation efficiency of the cooling module 100.

In some embodiments, the metal heat conduction block 220 is soldered in the fixing plate 210, for example, by a low temperature soldering process. In some embodiments, the metal heat conduction block 220 and the fixing plate 210 are soldered by a tin-bismuth alloy or a tin-silver-copper alloy.

Further referring to FIG. 2 and FIG. 3, the heat pipes are removed therefrom to conveniently illustrate the heat dissipation base. The heat dissipation base 300 includes a fixing plate 310 and a metal heat conduction block 320. The fixing plate 310 further includes a plurality of heat pipe partitions 312 and a plurality of heat pipe fixing openings 314, the heat pipe fixing openings 314 are formed between the heat pipe partitions 312 to fix the heat pipes. The metal heat conduction block 320 is fixed in the fixing plate 310. It is worth noting that the fixing plate 310 further includes a plurality of supporting portions, for example, supporting portions 340 and supporting portions 350, to support the shear surfaces 301 at the two ends of the metal heat conduction block 320.

The supporting portions 340 and the supporting portions 350 are respectively located adjacent to the shear surfaces 301 at the two ends of the fixing plate 310 and the metal heat conduction block 320 to effectively prevent the metal heat conduction block 320 from being recessed.

In some embodiments, the supporting portions 340 and the supporting portions 350 are respectively formed at the terminal portions of the heat pipe partitions 312 and close to the shear surfaces 301.

In some embodiments, the metal heat conduction block 320 can be a high thermal conductivity metal block with, for example, a copper block. The fixing plate 310 can be made of metal material, for example, aluminum or copper.

In some embodiments, the heat pipe fixing openings 314 forms an angle 360 with the shear surfaces 301 so that the terminal portions of the heat pipe partitions 312 forms an angle with the shear surfaces 301 and further forms the supporting portions 340 and the supporting portions 350 to effectively support the metal heat conduction block 320.

In some embodiments, the angle 360 is greater than 5 degrees and less than 60 degrees. However, the present invention is not limited thereto, and the required supporting portions can be formed at any position adjacent to the shear surfaces when the angle 360 is greater than 0 degrees.

In some embodiments, the metal heat conduction block 320 is soldered in the fixing plate 310, for example, by a low temperature soldering process. In some embodiments, the metal heat conduction block 320 and the fixing plate 310 are soldered by a tin-bismuth alloy or a tin-silver-copper alloy.

Figure 4:
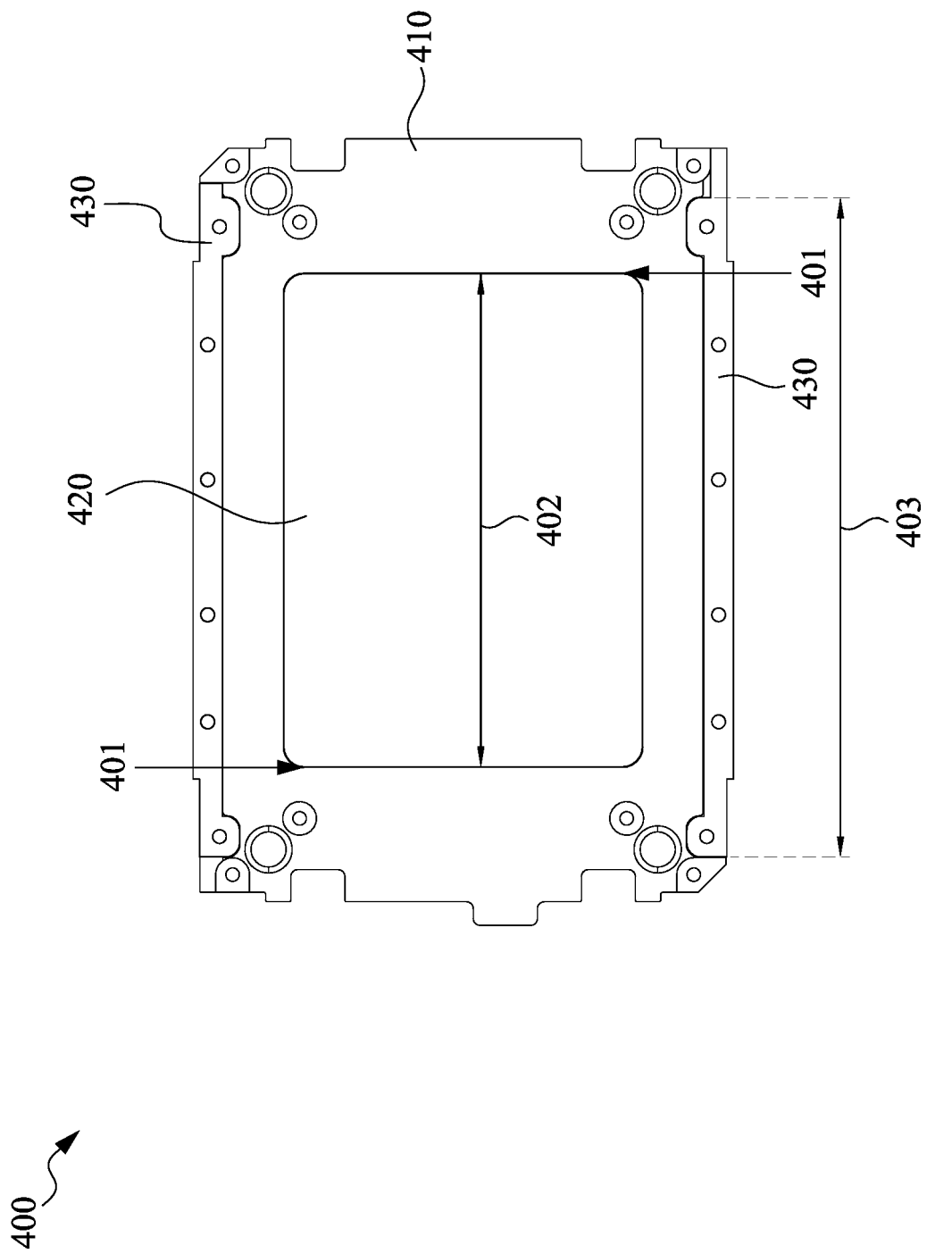
FIG. 4 illustrates a schematic top view showing a heat dissipation base according to another embodiment of the present invention.

Further referring to FIG. 4, the heat dissipation base 400 includes a plurality of supporting portions 430, for example, a plurality of reinforcement ribs fixed on the two sides, perpendicular to the shear surfaces 401, of the fixing plate 410. A length 403 of the supporting portions 430 is greater than a length 402 of the metal heat conduction block 420, and a material strength of the supporting portions 430 is preferably greater than the material strength of the fixing plate 410 and the metal heat conduction block 420 to further increase the strength of the fixing plate 410 so as to prevent from defects, for example, depressions formed between the fixing plate 410 and the metal heat conduction block 420.

In some embodiments, the supporting portions 430 can be a plurality of stainless reinforcement ribs, for example, plate-shaped, L-shaped or U-shaped reinforcement ribs, fixed on the fixing plate 410 and disposed close to the side surfaces of the fixing plate 410.

In some embodiments, the metal heat conduction block 420 is soldered in the fixing plate 410, for example, by a low temperature soldering process. In some embodiments, the metal heat conduction block 420 and the fixing plate 410 are soldered by a tin-bismuth alloy or a tin-silver-copper alloy.

Figure 5:
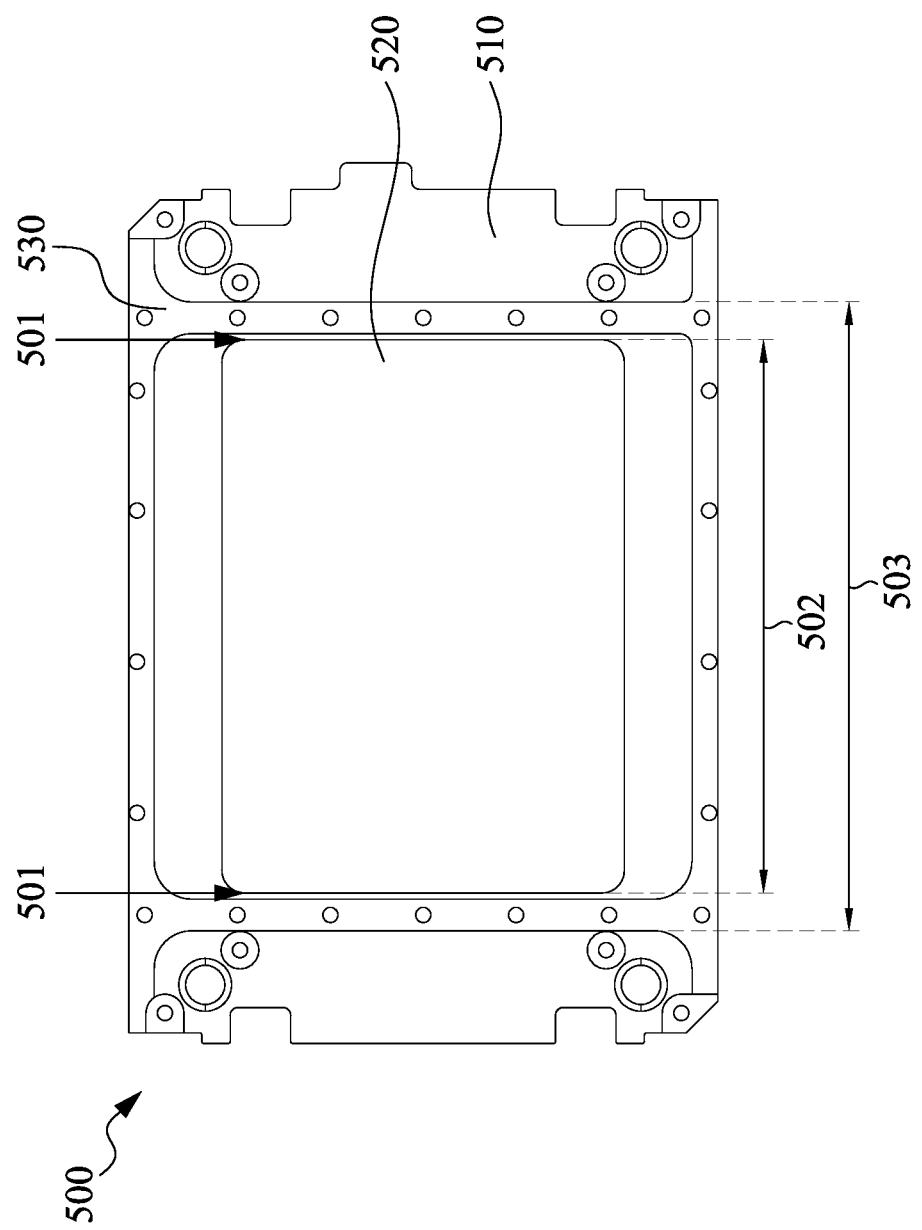
FIG. 5 illustrates a schematic top view showing a heat dissipation base according to further another embodiment of the present invention.

Referring to FIG. 5, the heat dissipation base 500 includes a supporting portion 530, for example, a ring-shaped reinforcement rib, surrounding the metal heat conduction block 520 and fixed on the periphery of the fixing plate 510 outside the shear surfaces 501. The supporting portion 530 can be formed by a plurality of reinforcement ribs or a ring-shaped reinforcement rib without departing from the spirit and the scope of the invention. In addition, a length 503 of the supporting portion 530 is greater than a length 502 of the metal heat conduction block 520, and a material strength of the supporting portion 530 is preferably greater than the material strength of the fixing plate 510 and the metal heat conduction block 520 to further increase the strength of the fixing plate 510 so as to prevent from defects, for example, depressions formed between the fixing plate 510 and the metal heat conduction block 520.

In some embodiments, the metal heat conduction block 520 is soldered in the fixing plate 510, for example, by a low temperature soldering process. In some embodiments, the metal heat conduction block 520 and the fixing plate 510 are soldered by a tin-bismuth alloy or a tin-silver-copper alloy.

Figure 6:
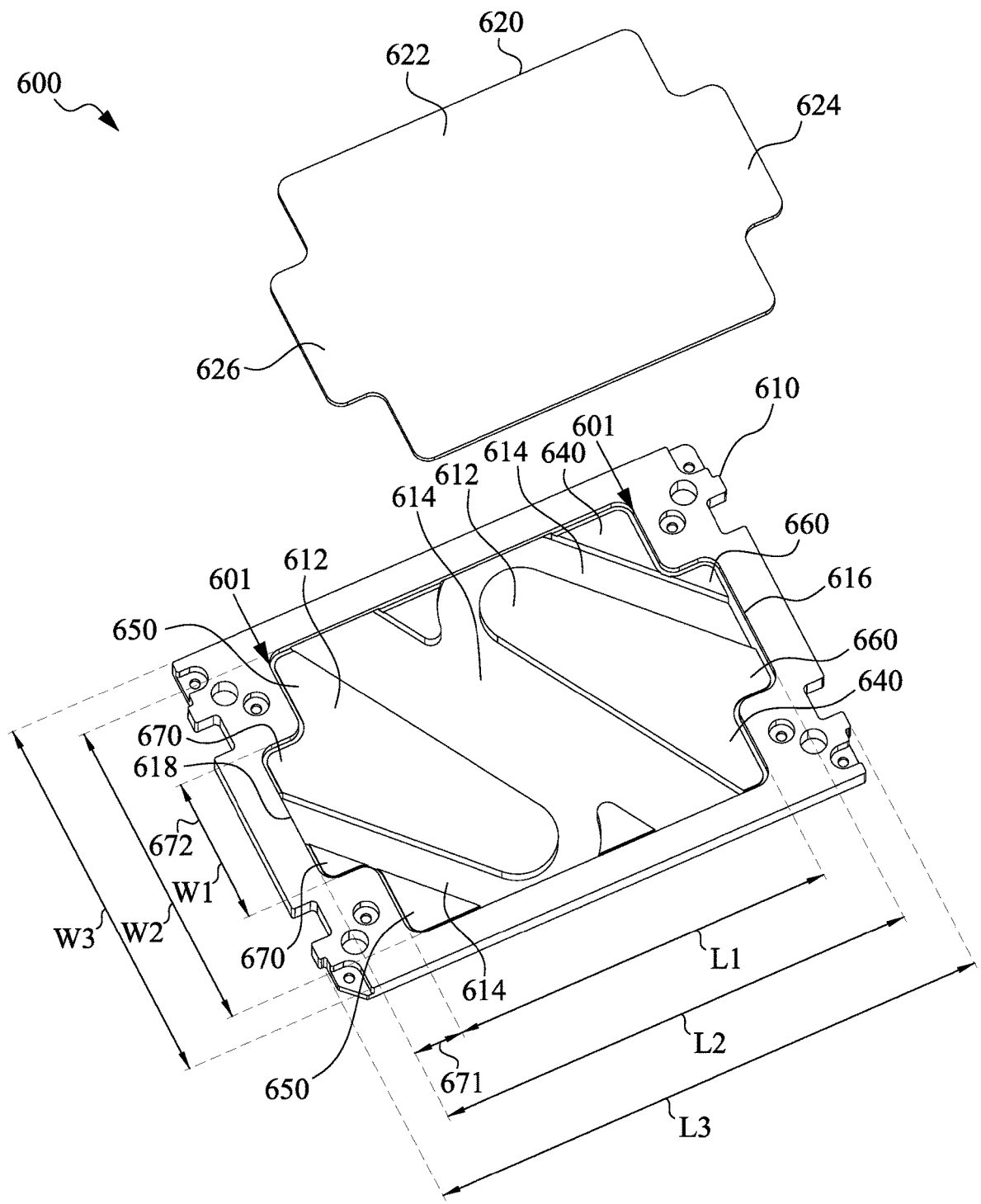
FIG. 6 illustrates a schematic exploded view showing a heat dissipation base according to still another embodiment of the present invention.

Referring to FIG. 6, the heat dissipation base 600 includes a fixing plate 610 and a metal heat conduction block 620. The fixing plate 610 further includes a plurality of heat pipe partitions 612 and a plurality of heat pipe fixing openings 614, and the heat pipe fixing openings 614 are formed between the heat pipe partitions 612 to fix the heat pipes. The metal heat conduction block 620 is fixed in the fixing plate 610. It is worth noting that the fixing plate 610 further includes a plurality of supporting portions, for example, partition supporting portions 640 and partition supporting portions 650, extended supporting portions 660 and extended supporting portions 670 to support the shear surfaces 601 at the two ends of the metal heat conduction block 620.

In some embodiments, the metal heat conduction block 620 includes a metal heat conduction block main body 622, a metal heat conduction block extended portion 624 and a metal heat conduction block extended portion 626. The metal heat conduction block extended portion 624 and the metal heat conduction block extended portion 626 are formed at the two ends of the metal heat conduction block main body 622, and protruded from the metal heat conduction block main body 622. The partition supporting portions 640 and the partition supporting portions 650 are utilized to support the metal heat conduction block main body 622 at the inner sides of the shear surfaces 601 of the metal heat conduction block 620, and the extended supporting portions 660 and the extended supporting portions 670 can be utilized to support the metal heat conduction block extended portion 624 and the metal heat conduction block extended portion 626 to further prevent from defects, for example, depressions formed between the fixing plate 610 and the metal heat conduction block 620.

In some embodiments, the fixing plate 610 includes an extended indentation 616 and an extended indentation 618 formed at the two ends of the fixing plate 610, and the extended supporting portions 660 and the extended supporting portions 670 are respectively located in the extended indentation 616 and the extended indentation 618. In addition, the metal heat conduction block extended portion 624 and the metal heat conduction block extended portion 626 are respectively positioned in the extended indentation 616 and the extended indentation 618 and fixed on the extended supporting portions 660 and the extended supporting portions 670.

In some embodiments, the metal heat conduction block 620 is soldered in the fixing plate 610, for example, by a low temperature soldering process. In some embodiments, the metal heat conduction block 620 and the fixing plate 610 are soldered by a tin-bismuth alloy or a tin-silver-copper alloy.

In some embodiments, an extended supporting portion length 671 of the extended supporting portion 670 of the fixing plate 610 is less than a length L1 of the metal heat conduction block 620 about 25%, and an extended supporting portion width 672 of the extended supporting portion 670 is about 35% to 75% of a width W2 of the metal heat conduction block 620.

In some embodiments, a length L3 of the fixing plate 610 is about 110 millimeters (mm), a total length L2 from the extended supporting portion 660 to the extended supporting portion 670 is about 93 mm, and the length L1 of the metal heat conduction block main body 622 of the metal heat conduction block 620 is about 73 mm. In addition, a width W1 of the extended supporting portion 670 also referred as an extended supporting portion width 672 is about 30 mm, the width W2 of the metal heat conduction block main body 622 of the metal heat conduction block 620 is about 53 mm, and a width W3 of the fixing plate 610 is about 78 mm. The above is only exemplary implementations of the present invention, rather than for limiting protection scope of the present invention.

Figure 7:
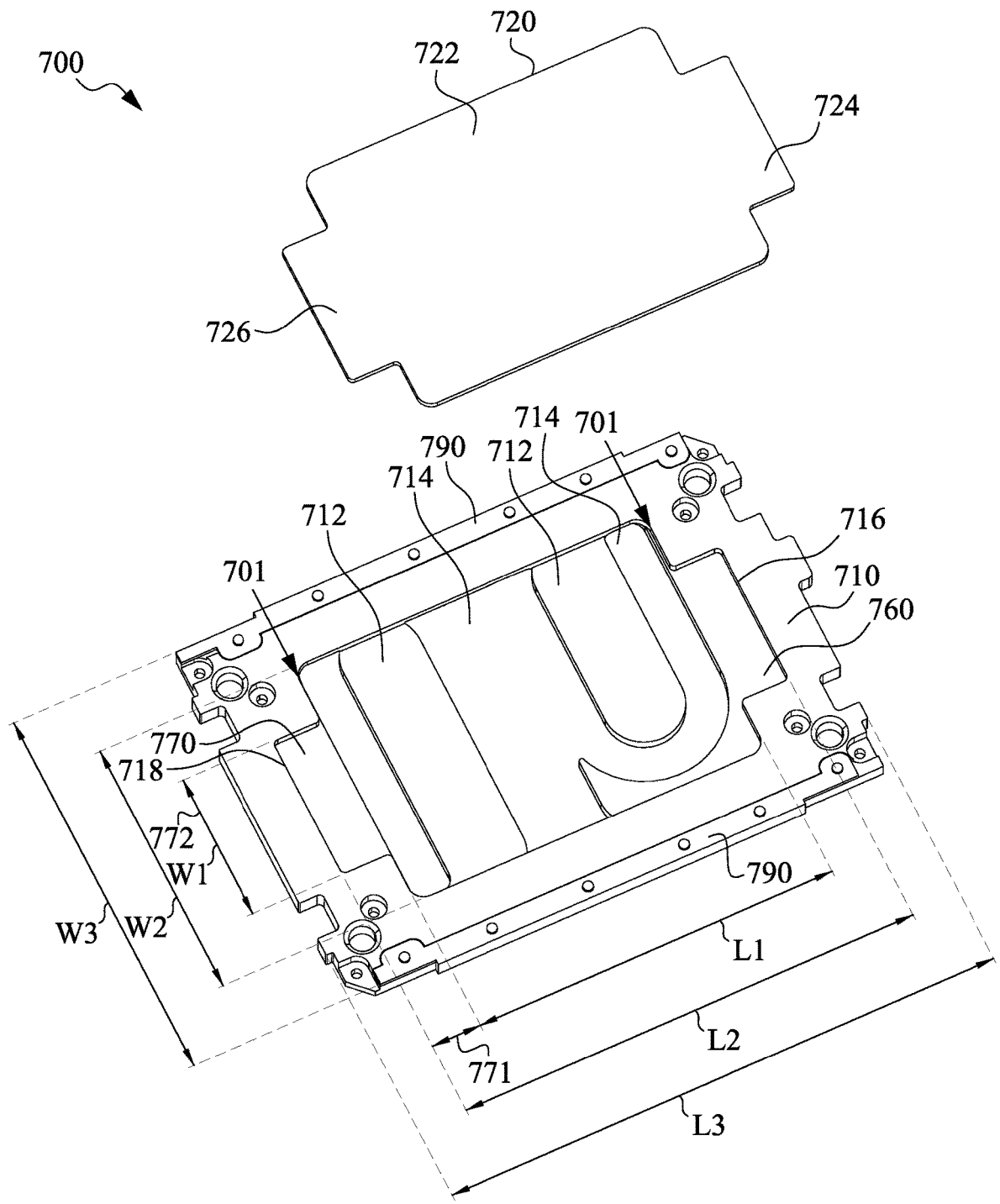
FIG. 7 illustrates a schematic exploded view showing a heat dissipation base according to still further another embodiment of the present invention.

Referring to FIG. 7, the heat dissipation base 700 includes a fixing plate 710 and a metal heat conduction block 720. The fixing plate 710 further includes a plurality of heat pipe partitions 712 and a plurality of heat pipe fixing openings 714, and the heat pipe fixing openings 714 are formed between the heat pipe partitions 712 to fix the heat pipes. The metal heat conduction block 720 is fixed in the fixing plate 710. It is worth noting that the fixing plate 710 further includes a plurality of supporting portions, for example, an extended supporting portion 760 and an extended supporting portion 770 to support the metal heat conduction block extended portions outside the shear surfaces 701 of the metal heat conduction block 720.

In some embodiments, the metal heat conduction block 720 includes a metal heat conduction block main body 722, a metal heat conduction block extended portion 724 and a metal heat conduction block extended portion 726. The metal heat conduction block extended portion 724 and the metal heat conduction block extended portion 726 are formed at the two ends of the metal heat conduction block main body 722, and protruded from the metal heat conduction block main body 722. The extended supporting portion 760 and the extended supporting portion 770 can be utilized to support the metal heat conduction block extended portion 724 and the metal heat conduction block extended portion 726 to further prevent from defects, for example, depressions formed between the fixing plate 710 and the metal heat conduction block 720.

Similar to FIG. 6, in some embodiments, the fixing plate 710 includes an extended indentation 716 and the extended indentation 718 formed at the two ends of the fixing plate 710, and the extended supporting portion 760 and the extended supporting portion 770 are respectively located in the extended indentation 716 and the extended indentation 718. In addition, the metal heat conduction block extended portion 724 and the metal heat conduction block extended portion 726 are respectively positioned in the extended indentation 716 and the extended indentation 718 and fixed on the extended supporting portion 760 and the extended supporting portion 770.

In some embodiments, the metal heat conduction block 720 is soldered in the fixing plate 710, for example, by a low temperature soldering process. In some embodiments, the metal heat conduction block 720 and the fixing plate 710 are soldered by a tin-bismuth alloy or a tin-silver-copper alloy.

In some embodiments, an extended supporting portion length 771 of the extended supporting portion 770 of the fixing plate 710 is less than a length L1 of the metal heat conduction block 720 about 25%, and an extended supporting portion width 772 of the extended supporting portion 770 is about 35% to 75% of a width W2 of the metal heat conduction block 720.

In some embodiments, a length L3 of the fixing plate 710 is about 110 mm, a total length L2 from the extended supporting portion 760 to the extended supporting portion 770 is about 93 mm, and the length L1 of the metal heat conduction block main body 722 of the metal heat conduction block 720 is about 73 mm. In addition, a width W1 of the extended supporting portion 770 also referred as an extended supporting portion width 772 is about 30 mm, the width W2 of the metal heat conduction block main body 722 of the metal heat conduction block 720 is about 53 mm, and a width W3 of the fixing plate 710 is about 78 mm. The above is only exemplary implementations of the present invention, rather than for limiting protection scope of the present invention.

In FIG. 7, the heat pipe fixing openings 714 are parallel with the shear surfaces 701. The metal heat conduction block extended portion 724 and the metal heat conduction block extended portion 726 can be fixed on the extended supporting portion 760 and the extended supporting portion 770 in the extended indentation 716 and the extended indentation 718. Accordingly, the orientation of the heat pipe is not necessary to be changed but the defects, such as depressions formed between the fixing plate 710 and the metal heat conduction block 720, can be effectively avoided.

In some embodiments, the fixing plate 710 further includes reinforcement ribs 790 to further increase the strength of the fixing plate 710 to solve the defects, for example, depressions formed between the fixing plate 710 and the metal heat conduction block 720. In some embodiments, the reinforcement ribs 790 can be plate-shaped, L-shaped or U-shaped reinforcement ribs, or the reinforcement ribs 790 forms a ring-shaped reinforcement rib without departing from the spirit and the scope of the invention.

Accordingly, the heat dissipation base can effectively increase the connection strength between the fixing plate and the metal heat conduction block, increase the shear force resistant capability, solve the depression defects and increase the heat dissipation efficiency of the heat dissipation base and the heat dissipation efficiency of the cooling module with the heat dissipation base.

As is understood by a person skilled in the art, the foregoing preferred embodiments of the present invention are illustrative of the present invention rather than limiting of the present invention. It is intended that various modifications and similar arrangements be included within the spirit and scope of the appended claims, the scope of which should be accorded the broadest interpretation so as to encompass all such modifications and similar structures.

What is claimed is:

1. A heat dissipation base, comprising:
   a fixing plate, the fixing plate comprising a plurality of heat pipe partitions and a plurality of heat pipe fixing openings, wherein the heat pipe fixing openings are formed between the heat pipe partitions;
   a plurality of heat pipes fixed in the heat pipe fixing openings;
   a plurality of fins located on a first side of the fixing plate and contacting the heat pipes; and
   a metal heat conduction block fixed to the fixing plate at a second side of the fixing plate opposite the first, wherein the fixing plate further comprises a plurality of supporting portions on the second side to support shear surfaces at two ends of the metal heat conduction block;
   wherein the supporting portions include a plurality of reinforcement ribs formed on the second side of the fixing plate; and
wherein the fixing plate comprises a plurality of extended indentations formed at two ends of the fixing plate on the second side, and the supporting portions comprise a plurality of extended supporting portions formed in the extended indentations, wherein the metal heat conduction block comprises a metal heat conduction block main body and a plurality of metal heat conduction block extended portions formed at two ends of the metal heat conduction block main body, and the metal heat conduction block extended portions are positioned in the extended indentations and fixed on the extended supporting portion.

2. The heat dissipation base of claim 1, wherein the heat pipe fixing openings form an angle with the shear surfaces.

3. The heat dissipation base of claim 2, wherein the angle is greater than 5 degrees and less than 60 degrees.

4. The heat dissipation base of claim 1, wherein the supporting portions comprise a plurality of reinforcement ribs fixed on two sides, perpendicular to the shear surfaces, of the fixing plate.

5. The heat dissipation base of claim 1, wherein the supporting portions comprise a ring-shaped reinforcement rib surrounding the fixing plate and the metal heat conduction block.

6. The heat dissipation base of claim 1, wherein the supporting portions further comprise a plurality of partition supporting portions formed adjacent to the shear surfaces to further support the metal heat conduction block.

7. The heat dissipation base of claim 6, wherein an extended supporting portion length of the extended supporting portions of the fixing plate is less than 25% of a length of the metal heat conduction block, and an extended supporting portion width of the extended supporting portions is about 35% to 75% of a width of the metal heat conduction block.

8. The heat dissipation base of claim 7, wherein the metal heat conduction block and the fixing plate are soldered by a tin-bismuth alloy or a tin-silver-copper alloy.

* * * * *